United States Patent [19]
Ienaga

[11] Patent Number: 5,735,129
[45] Date of Patent: Apr. 7, 1998

[54] SPECIMEN-COOLING SYSTEM FOR ELECTRON MICROSCOPE OR THE LIKE

[75] Inventor: Katsuji Ienaga, Tokyo, Japan

[73] Assignee: Jeol Ltd., Tokyo, Japan

[21] Appl. No.: 738,224

[22] Filed: Oct. 25, 1996

[51] Int. Cl.⁶ .................... H01J 37/20; F25B 19/00
[52] U.S. Cl. ........................ 62/51.1; 250/443.1
[58] Field of Search .................... 62/51.1; 250/443.1

[56] References Cited

U.S. PATENT DOCUMENTS

| | | | |
|---|---|---|---|
| 4,663,944 | 5/1987 | Bernius et al. | 62/51.1 |
| 4,833,330 | 5/1989 | Swann et al. | 62/51.1 X |
| 4,848,093 | 7/1989 | Simmonds et al. | 62/51.1 X |
| 4,870,830 | 10/1989 | Hohenwarter et al. | 62/51.1 X |
| 4,931,650 | 6/1990 | Lowe et al. | 62/51.1 X |
| 4,950,901 | 8/1990 | Jones et al. | 62/51.1 X |
| 4,977,749 | 12/1990 | Sercel | 62/51.1 |
| 5,039,864 | 8/1991 | Kondo | 250/442.1 |
| 5,088,290 | 2/1992 | Yasue | 62/51.1 |
| 5,249,425 | 10/1993 | Longsworth | 62/51.1 X |
| 5,417,072 | 5/1995 | Silver et al. | 62/51.1 X |

*Primary Examiner*—Christopher Kilner
*Attorney, Agent, or Firm*—Webb Ziesenheim Bruening Logsdon Orkin & Hanson, P.C.

[57] ABSTRACT

A cooling system for an electron microscope specimen comprises a refrigerant container, a passage for introducing the refrigerant into a heat-exchanging position, a flow rate-adjusting valve mounted in an exhaust passage and a control unit. The flow rate of gas produced by evaporation is adjusted by a rate-adjusting valve. The control unit establishes either a maximum flow rate mode for rapid cooling or a minimum flow rate mode for observation of an image.

6 Claims, 6 Drawing Sheets

SPECIMEN-COOLING SYSTEM FOR ELECTRON MICROSCOPE OR THE LIKE

FIELD OF THE INVENTION

The present invention relates to a system for maintaining a specimen at a low temperature to permit one to observe the specimen in a low-temperature state.

BACKGROUND OF THE INVENTION

Referring to FIG. 6, there is shown a conventional transmission electron microscope. This microscope, generally indicated by reference numeral 1, has a microscope column 2 whose inside is maintained as a vacuum. The microscope further includes an electron gun 3 for producing an electron beam 4, an illumination lens 5, an illumination system aperture 6, a specimen-cooling holder 8 for maintaining a specimen 7 to be observed at a low temperature, an objective lens 9, an imaging system aperture 10, an imaging lens 11, a fluorescent screen 12 and an observation window 13.

In the operation of this electron microscope 1, the electron beam 4 emitted by the electron gun 3 is made to converge by the illumination lens 5 and by the illumination system aperture 6 and focused onto the specimen 7. The beam 4 is then penetrated through the specimen 7 or scattered. The electron beam 4 is focused by the objective lens 9 and restricted by the imaging system aperture 10. Finally, the beam is projected onto the fluorescent screen 12 by the imaging lens 11. The magnified image on the fluorescent screen 12 is observed through the observation window 13.

It is sometimes necessary that the specimen be observed with the electron microscope 1 at a temperature lower than ambient temperature. In this case, the specimen must be kept at a low temperature during the observation. Accordingly, it is common practice to use the specimen-cooling holder 8 for maintaining the specimen 7 at a low temperature.

FIG. 7 shows one example of the specimen-cooling holder 8. This holder 8 comprises a housing 18 incorporating a refrigerant-holding vessel 15 having a high adiabatic or insulating property. A refrigerant 14, such as liquid nitrogen or liquid helium, is held in the vessel 15. A specimen 7 is supported by a specimen stage 16. The low temperature of the refrigerant 14 is transmitted to the specimen stage 16 by a low temperature transfer rod 17. The inside of the housing 18 is maintained as a vacuum. The transfer rod 17 is held in the housing 18, as well as the refrigerant-holding vessel 15. The low temperature of the refrigerant 14 transmitted via the refrigerant-holding vessel 15 is then transmitted to the specimen stage 16 by the transfer rod 17. The low temperature is then transmitted from the specimen stage 16 to the specimen 7. As a result, the specimen 7 continues to be cooled.

FIG. 8 shows another example of the specimen-cooling holder 8. It is to be noted that like components are indicated by like reference numerals in various figures and that those components which have been already described will not be described below. This specimen-cooling holder 8 comprises the refrigerant-holding vessel 15, the specimen stage 16, and a thin refrigerant introduction tube 19 for introducing the refrigerant 14 from the vessel 15 into the specimen stage 16. The introduction tube 19 consists of a pipe made of stainless steel. This tube 19 extends from the refrigerant-holding vessel 15, is joined to the specimen stage 16 and is bent upwardly like the letter "U". Then, the tube 19 hermetically passes through the housing 18 and opens to the outside. In this holder 8, the refrigerant 14 is forced out of the vessel 15, passed through the introduction tube 19, and is introduced into the junction of the specimen stage 16. Low temperature of the refrigerant at this location cools the specimen 7 via the specimen stage 16.

In the specimen-cooling holder 8 shown in FIGS. 6 and 8, when the refrigerant 14 cools the refrigerant-holding vessel 15, the specimen stage 16, the low temperature transfer rod 17, the refrigerant introduction tube 19 or the specimen 7, the refrigerant 14 evaporates. Concomitantly, mechanical vibrations occur which lead to a deterioration of the resolution of the electron microscope. This phenomenon is minimal where these components 15, 16, 17 and 19 are cooled sufficiently as well as the specimen 7, i.e., cooled close to the temperature of the refrigerant 14. Therefore, if the specimen 7 cooled down close to the temperature of the refrigerant 14 is observed, the amount of mechanical vibration caused by the evaporation is minimal. Hence, the resolution of the electron microscope image is least affected.

However, if a heater producing heat is placed on or near the specimen stage 16 to maintain the specimen 7 at a temperature considerably higher than that of the refrigerant 14, and if the specimen 7 is observed under this condition, the refrigerant 14 evaporates violently. This increases the amount of mechanical vibrations, thus vibrating the specimen 7. As a result, the resolution of the electron microscope 1 deteriorates. Consequently, the range of usable temperatures of the specimen-cooling holder 8 is limited to a narrow range of temperatures which are close to the temperature of the refrigerant and yet do not deteriorate the resolution of the electron microscope image.

SUMMARY OF THE INVENTION

In view of the foregoing problem, the present invention has been made. It is an object of the present invention to provide a specimen-cooling system which is for use with an electron microscope or the like and which permits the temperature of a specimen to be controlled within the widest attainable range, thus enabling one to more precisely observe the specimen at a low temperature that is higher than that of the used refrigerant.

The above-described object is achieved in accordance with the teachings of the invention by a cooling system for use with an electron microscope or the like, said cooling system comprising: a refrigerant-holding means for holding a refrigerant; a refrigerant introduction passage for introducing said refrigerant from said refrigerant-holding means into a given heat-exchanging position; a low temperature transfer means for transmitting low temperature of said refrigerant placed at said heat-exchanging position in said refrigerant introduction passage to a specimen; an exhaust passage which is in communication with said refrigerant introduction passage and through which gas produced by evaporation of said refrigerant flows; a flow rate-adjusting means mounted in said exhaust passage and acting to vary flow rate of said gas; and a control unit capable of establishing a plurality of modes of operation including a maximum flow rate mode in which said specimen is cooled rapidly and a minimum flow rate mode adapted for observation with the electron microscope. The control unit controls said flow rate-adjusting means according to the flow rate of said gas such that said cooling system operates in one of said modes of operation.

In one embodiment of the invention, the exhaust passage includes a parallel circuit consisting of first and second conduit lines juxtaposed. The flow rate-adjusting means comprises a solenoid valve mounted in the first conduit line and a flow rate-adjusting valve mounted in the second conduit line. The solenoid valve sets the flow rate of the gas to the maximum flow rate when the solenoid valve is open. The flow rate-adjusting valve is so set up or adjusted that the flow rate of the gas flowing through the exhaust passage assumes the minimum flow rate. The control unit controls the solenoid valve in such a way that it opens the solenoid valve in the maximum flow rate mode and closes the solenoid valve in the minimum flow rate mode.

In another embodiment of the invention, the low temperature transfer means comprises a heat storage body and a temperature transfer rod for transmitting low temperature stored in the heat storage body to the specimen. The heat storage body is in thermal communication with the heat-exchanging position in the refrigerant introduction passage and stores the low temperature.

In a further embodiment of the invention, the control unit establishes the maximum flow rate mode and the minimum flow rate mode alternately and repeatedly.

Other objects and features of the invention will appear in the course of the description thereof which follows.

DETAILED DESCRIPTION OF THE INVENTION

Figure 1:
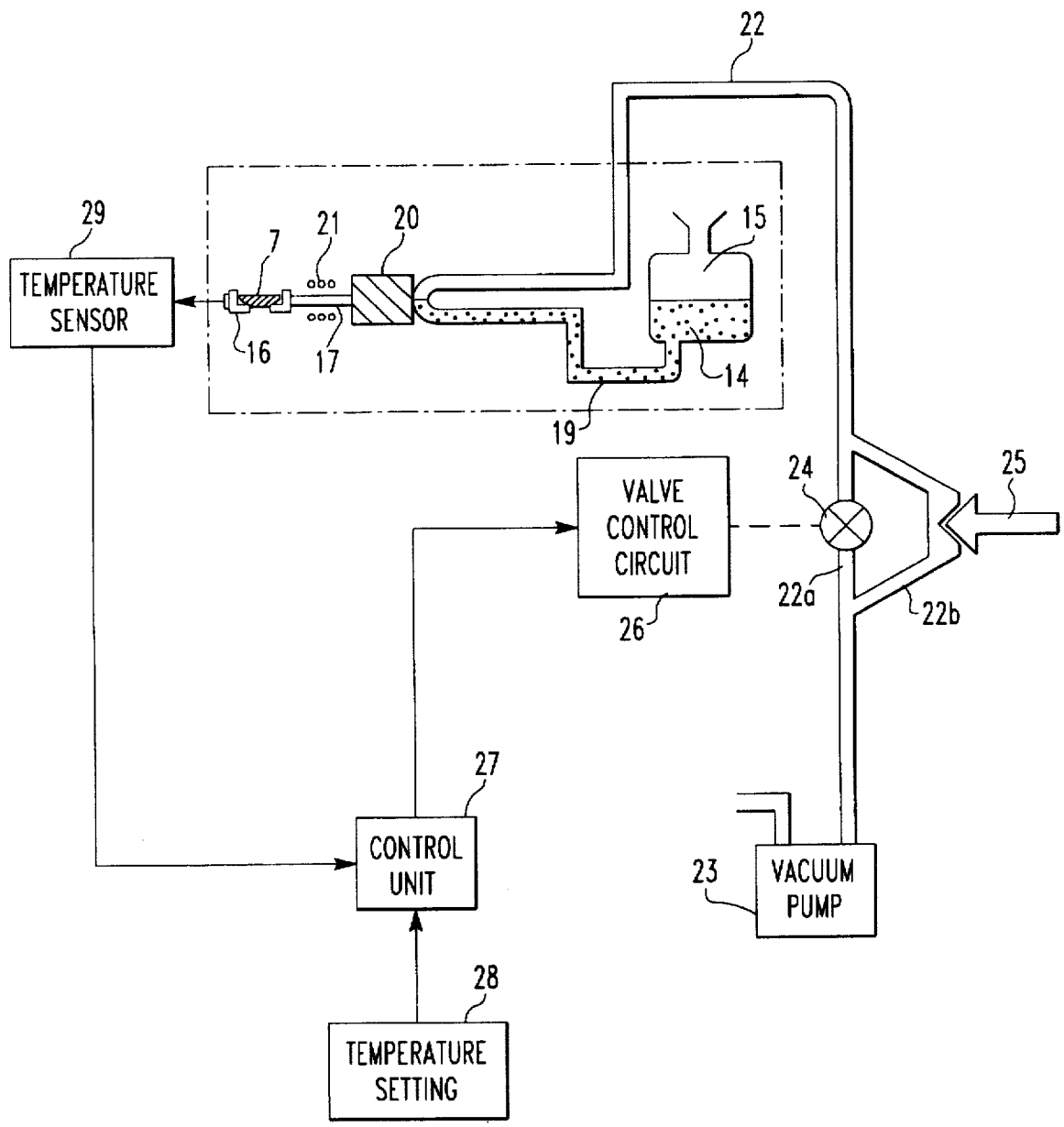
FIG. 1 is a schematic diagram of a specimen-cooling system according to the present invention.
Figure 8:
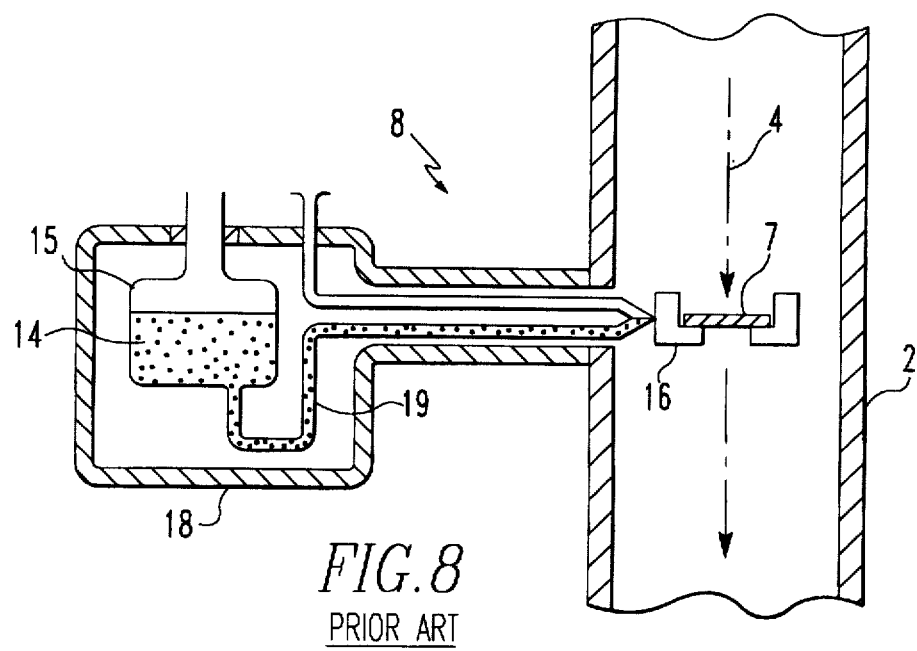
FIG. 8 is a schematic vertical cross section of another conventional specimen-cooling system.

Referring to FIG. 1, a specimen-cooling system, according to the present invention, is schematically shown, the system being for use with an electron microscope or the like. The specimen-cooling system is similar to the conventional specimen-cooling system shown in FIG. 8 except for the following points. In the system shown in FIG. 8, the refrigerant introduction tube 19 is directly joined to the specimen stage 16. In the novel system shown in FIG. 1, the refrigerant introduction tube 19 has a U-shaped bent portion. A heat storage body 20 is joined to the outside of this U-shaped bent portion of the tube 19 and in good thermal exchanging relation to the introduction tube 19. This heat storage body 20 is also connected to the specimen stage 16 by the low temperature transfer rod 17. A heater 21 is mounted around this transfer rod 17.

The present embodiment is further characterized in that one end of exhaust tubing 22 is connected to the refrigerant introduction tube 19 at a position located downstream of the junction of the heat storage body 20. A vacuum pump 23 is connected with the other end of the exhaust tubing 22. The exhaust tubing 22 consists of a first conduit line 22a and a second conduit line 22b which are juxtaposed. A solenoid valve 24 is mounted in the first conduit line 22a. A flow rate-adjusting valve 25 consisting of a needle valve, for example, is mounted in the second conduit line 22b. The solenoid valve 24 and the flow-adjusting valve 25 act to adjust the flow rate of expelled gas after it is created by evaporation of the refrigerant 14. The solenoid valve 24 is opened and closed by a solenoid valve control circuit 26. When this solenoid valve 24 is open, the gas is discharged through both valves 24 and 25, and the flow rate is greatest, i.e., $Q_1$ (liters/min). When the solenoid valve 24 is closed, the gas flows through only the flow rate-adjusting valve 25, and the flow rate is controlled to minimum flow rate $Q_2$ (liters/min) by the flow rate-adjusting valve 25.

The novel specimen-cooling system can operate either in "cooling mode" or in "observation mode". In the cooling mode, the solenoid valve 24 is opened. Under this condition, the flow rate of the gas is the maximum flow rate $Q_1$. The amount of the refrigerant 14 evaporated assumes its maximum value. In consequence, a large amount of cold medium is stored in the storage body 20. In this cooling mode, the refrigerant 14 vaporizes in large quantity, thus imparting vibrations to the refrigerant introduction tube 19. The vibrations are transmitted to the specimen. As a result, the resolution of the final image deteriorates. Therefore, this mode of operation is not adapted for observation of images. On the other hand, in the observation mode, the solenoid valve 24 is closed. In this state, the flow rate of the gas takes its minimum value $Q_2$ (liters/min). The amount of the refrigerant 14 evaporated is reduced to a minimum and so the supply of the cold medium to the heat storage body 20 is reduced. In this observation mode, however, the amount of the refrigerant 14 evaporated is very small. The introduction tube 19 is little vibrated. Consequently, the resolution of the final image is less deteriorated. In this way, this mode of operation is suited for observation of images.

Referring also to FIG. 1, a control unit 27 controls the aforementioned solenoid valve control circuit 26 according to a specimen temperature-setting portion 28 and the output signal from a temperature sensor 29. This temperature sensor 29 detects the temperature of the specimen stage 16, i.e., the temperature of the heat storage body 20. The specimen temperature-setting portion 28 permits a user to set the specimen to a desired temperature.

The operation of the specimen-cooling system constructed as described above is next described. If the operator operates the specimen temperature-setting portion 28 to set the temperature of the specimen to a desired value, e.g., 70° K, then the control unit 27 sends a signal for opening the solenoid valve 24 to the solenoid valve control circuit 26. In response to this signal, the control circuit 26 opens the solenoid valve 24. As a result, the cooling system shown in FIG. 1 is placed in the cooling mode. The heat storage body 20 which is at normal temperature is rapidly cooled down. The specimen stage 16 is also cooled. The temperature of the specimen stage 16 is detected by the temperature sensor 29. The output signal from the sensor 29 indicating the temperature is sent to the control unit 27. When the temperature of the specimen state 16 reaches the preset specimen temperature, i.e., 70° K, the control unit 27 supplies a signal for closing the solenoid valve 24 to the solenoid valve control circuit 26. In this way, the solenoid valve 24 is closed. As a result, the cooling system shown in FIG. 1 is placed in the observation mode. In this observation mode, the image of the specimen is observed. As mentioned previously, vibrations of the specimen are greatly suppressed in this observation mode. Consequently, the specimen image with high resolution can be observed.

Figure 2:
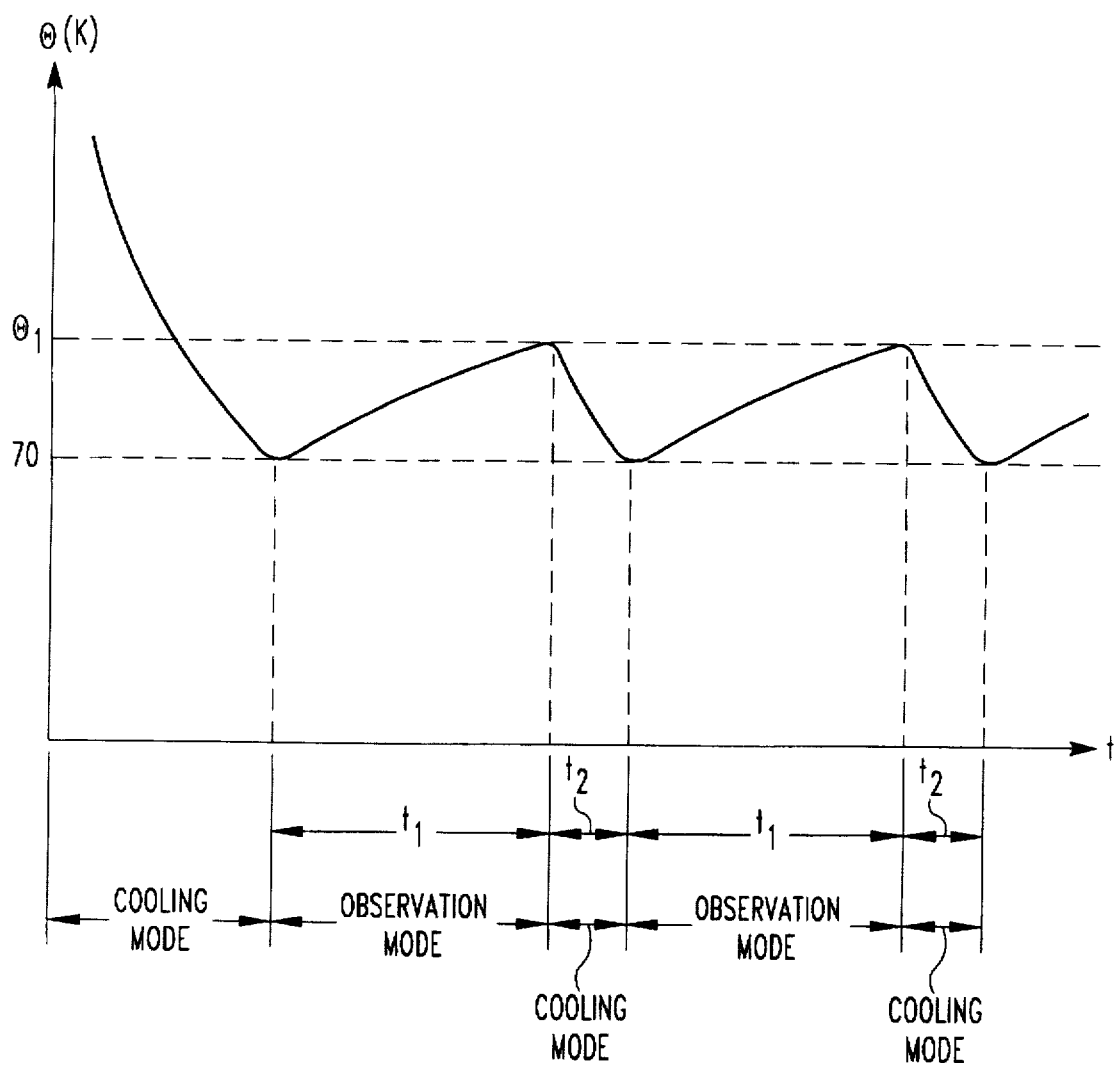
FIG. 2 is a graph illustrating variations in the temperature of a specimen stage used in the specimen-cooling system shown in FIG. 1.

In the observation mode, the flow rate of the gas is much smaller than in the cooling mode. Supply of the cold medium decreases and so the temperature of the heat storage body 20 is elevated. Therefore, if the image is observed in the observation mode, the specimen temperature rises from the preset temperature of 70° K with the lapse of time. Accordingly, in the cooling system of FIG. 1, observation time $t_1$ (s) and cooling time $t_2$ (s) are built into the control unit 27. When the observation time $t_1$ during which the image is being observed elapses, the solenoid valve control circuit 26 is controlled to place the system in the cooling mode for the cooling time $t_2$. During this cooling mode, the heat storage body 20 is cooled back to the preset temperature of 70° K. When the cooling time $t_2$ passes, the mode of operation of the cooling system is switched from the cooling mode to the observation mode. Then, the specimen image is observed. Subsequently, the cooling mode and the observation mode are alternately established. The observation of the image for the observation time $t_1$ is repeated a given number of times. FIG. 2 illustrates variations in the temperature of this specimen stage 16 occurring at this time.

Figure 3:
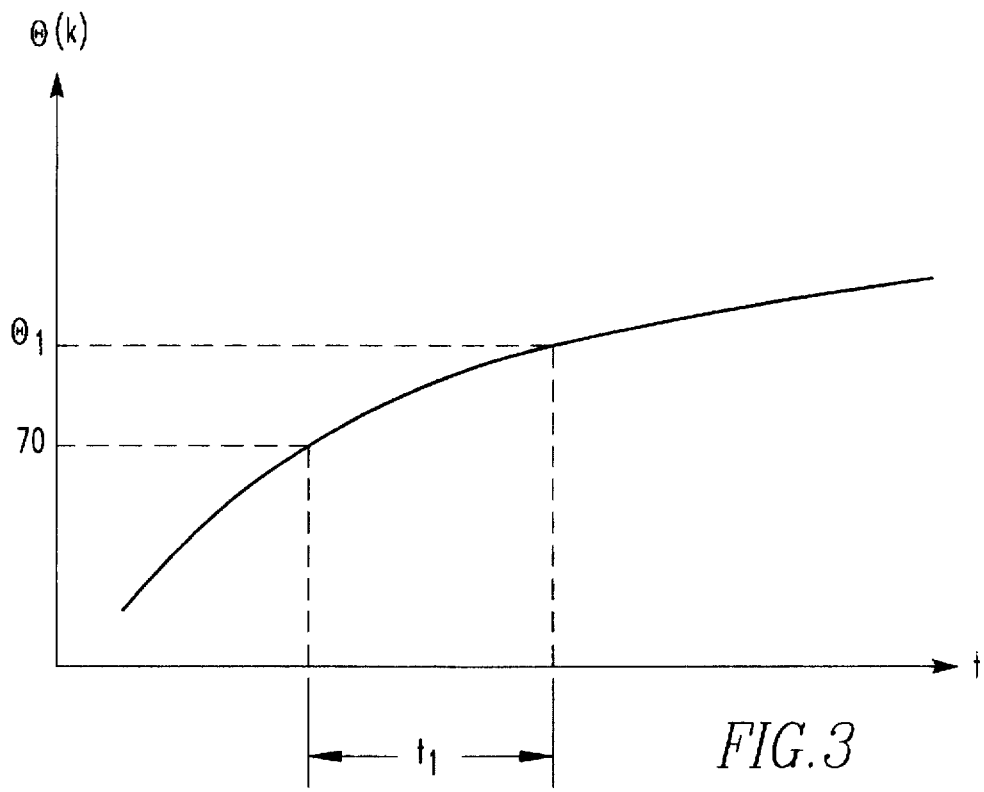
FIG. 3 is a graph illustrating a cooling period used by the specimen-cooling system shown in FIG. 1.
Figure 4:
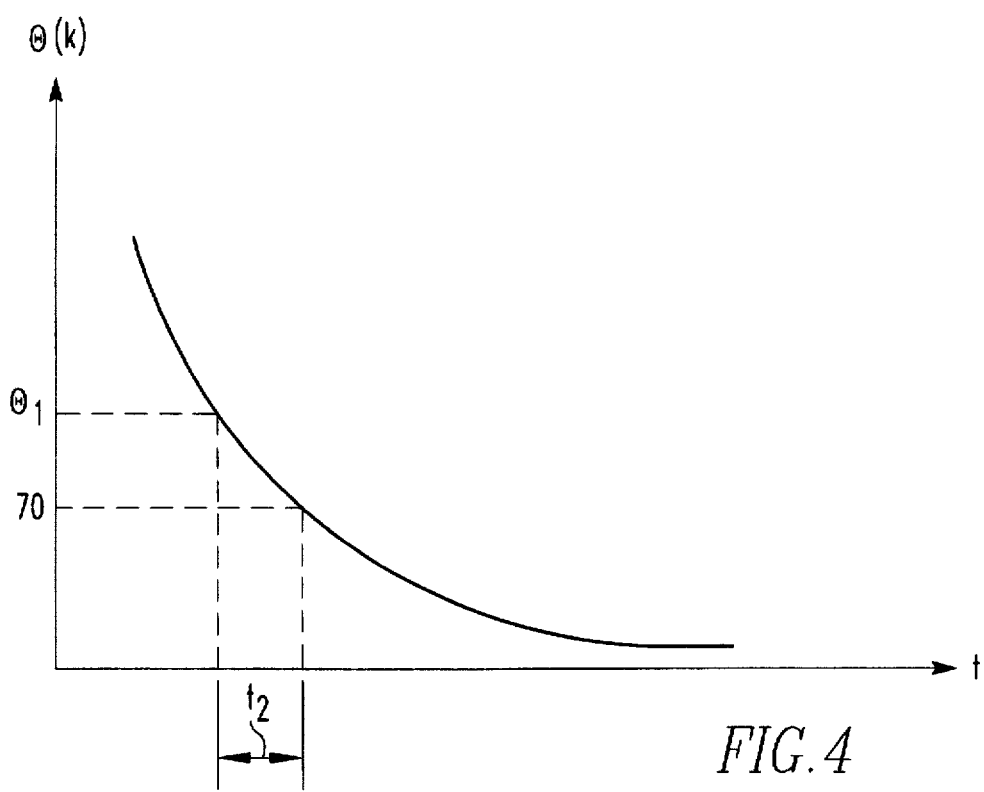
FIG. 4 is a graph illustrating another cooling period used by the specimen-cooling system shown in FIG. 1.

The manner in which the cooling time $t_2$ is set is next described by referring to FIGS. 3 and 4. Initially, the cooling system of FIG. 1 was in the cooling mode. The specimen stage 16 was cooled down close to the temperature of the refrigerant. Then, the mode of operation was switched to the observation mode. The resulting variations in the temperature of the specimen stage 16 were detected by the temperature sensor 29. The results are shown in FIG. 3 as described above, in the observation mode, the flow rate of the gas is much smaller than in the cooling mode. The temperature of the specimen stage 16 is elevated.

The specimen stage 16 has been cooled to a desired temperature, e.g., 70° K. Let $\theta_1$ (K) be the temperature that the specimen stage 16 has reached when the image has been observed for the observation time $t_1$ in the observation mode. The $\theta_1$ can be found from the data shown in FIG. 3 about variations in the temperature of the specimen stage 16.

The specimen stage 16 was cooled from room temperature to a temperature close to that of the refrigerant in the cooling mode of the cooling system shown in FIG. 1. The resulting variations in the temperature of the specimen stage 16 are shown in FIG. 4. Data shown in FIG. 4 about the variations in the temperature of the specimen stage 16 is also obtained by actually measuring the temperature of the specimen stage 16 by means of the temperature sensor 29.

The time $t_2$ taken for the specimen stage 16 to be cooled from the found temperature $\theta_1$ (K) down to 70° K can be found from the data shown in FIG. 4 about the variations in the temperature of the specimen stage 16. The time $t_2$ found in this way is established as the cooling time for the cooling system shown in FIG. 1.

The establishment of the time $t_2$ is done by the control unit 27. Therefore, the control unit 27 is equipped with data storage means for storing data about the variations in the temperature shown in FIGS. 3 and 4. The control unit 27 is further equipped with an arithmetic means for calculating the reached temperature $\theta_1$ after the observation time $t_1$ from a desired temperature at which an observation is started and then calculating the cooling time $t_2$ from the reached temperature $\theta_1$.

In the above embodiment, the specimen 7 is observed with higher accuracy than heretofore at a desired low temperature that is higher than that of the refrigerant 14 without deteriorating the electron microscope 1.

In the embodiment described above, the flow rate of the gas produced by evaporation of the refrigerant 14 is set to the maximum value in the cooling mode and to the minimum value in the observation mode. In this way, the flow rate is switched between the two modes of operation. The present invention is not limited to this scheme. For instance, an intermediate mode of operation may be added. In this intermediate mode, the flow rate of the gas is set to a value intermediate between the flow rate used for the cooling mode and the flow rate used for the observation mode. The cooling mode is used when the specimen is first cooled. When the specimen is cooled from the $\theta_1$ (K) to 70° K, this intermediate mode is used. In this case, the cooling time $t_2$ is slightly longer than the cooling time shown in FIG. 2.

It is to be understood that the heat storage body 20 is not essential for the above embodiment. For example, where the observation time is short or temperature variations occurring in the observation mode are small, the heat storage body can be omitted.

Furthermore, in the above embodiment, the temperature of the heat storage body 20, i.e., the temperature of the specimen 7, is controlled by means of the ratio of the time for which the solenoid valve 24 operates to the time for which the valve does not operate. Instead of the solenoid valve 24, a solenoid flow rate control valve capable of setting the flow rate to a desired value may be employed. In this case, the flow rate-adjusting valve 25 and the second conduit line 22b for the valve 25 are dispensed with.

Figure 5:
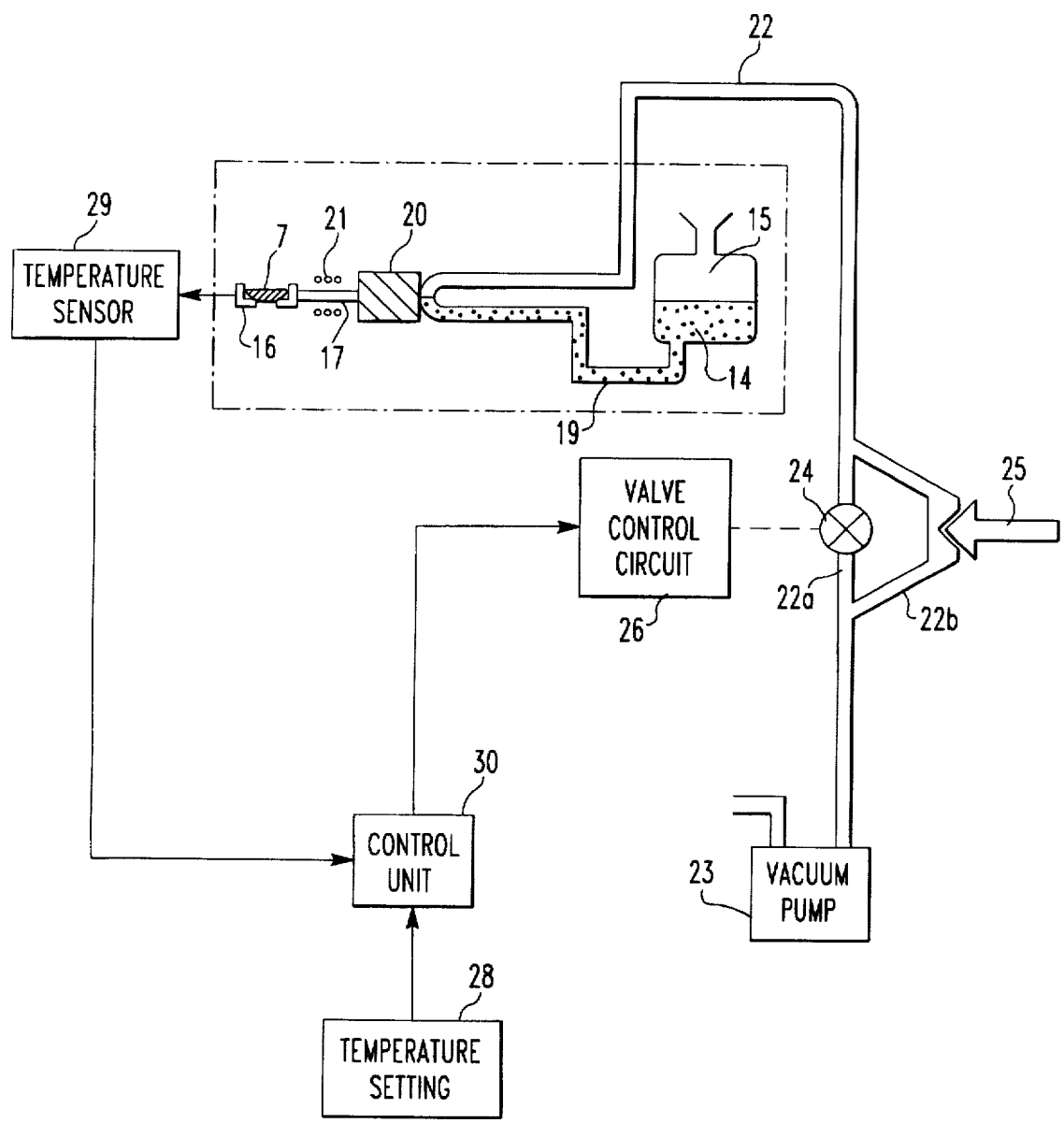
FIG. 5 is a schematic diagram of another specimen-cooling system according to the invention.
Figure 6:
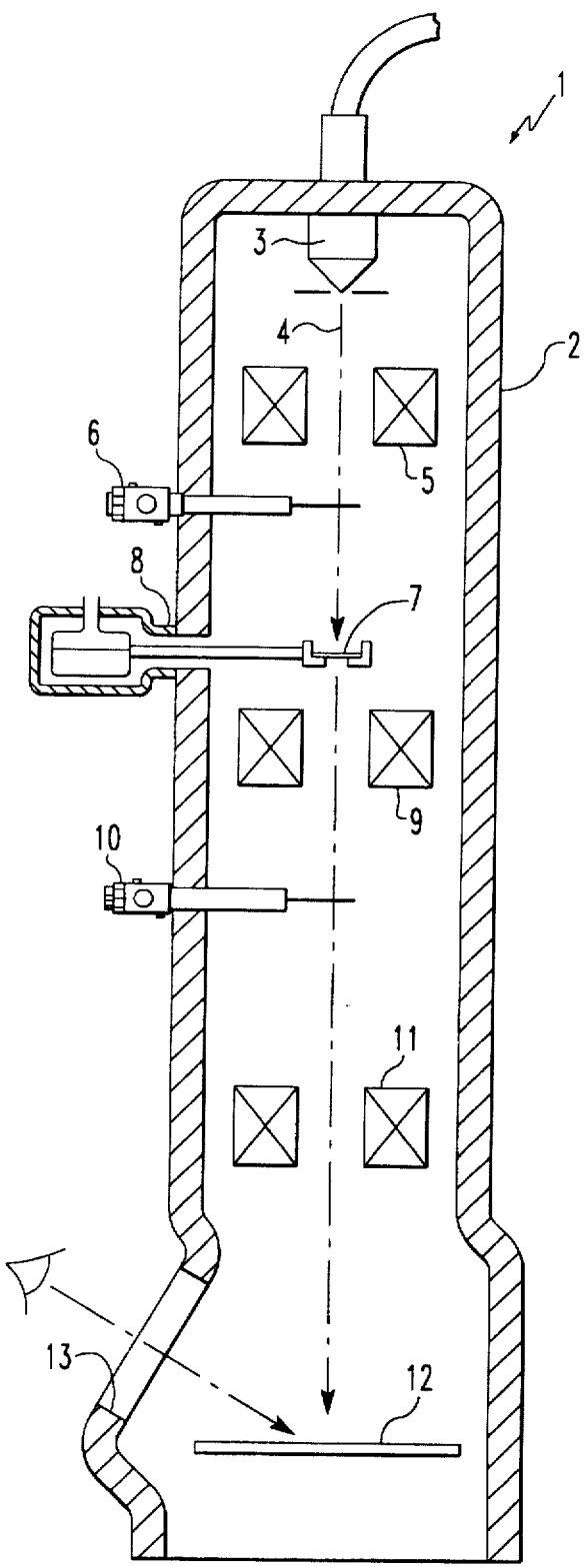
FIG. 6 is a schematic vertical cross section of a conventional electron microscope.
Figure 7:
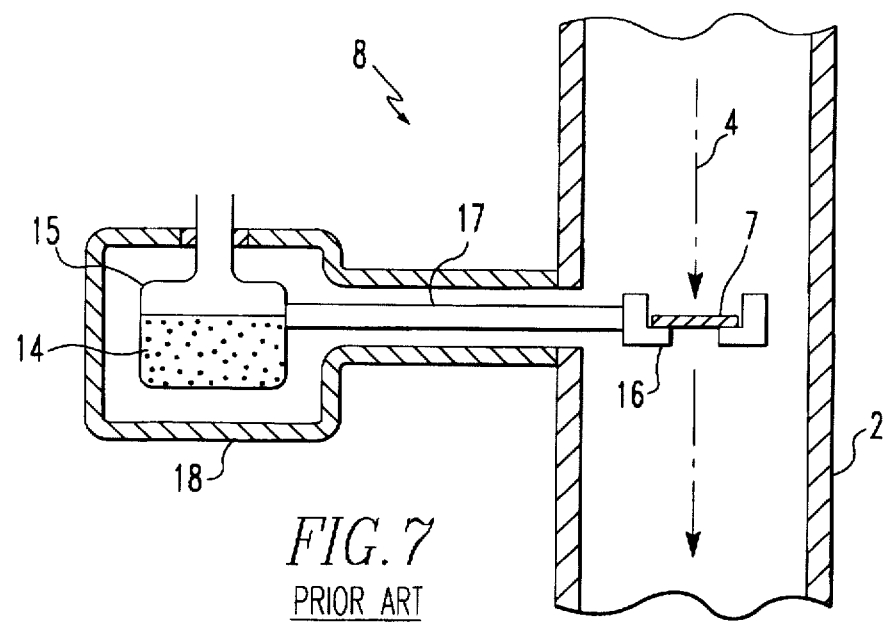
FIG. 7 is a schematic vertical cross section of a conventional specimen-cooling system.

Referring next to FIG. 5, there is shown a further specimen-cooling system according to the invention. This specimen-cooling system is similar to the specimen-cooling system described already in connection with FIG. 1 except that the control unit 27 is replaced by a control unit 30 that controls the solenoid valve control circuit 26. This specimen-cooling system shown in FIG. 5 is mounted in an electron microscope which does not require the operator to set the specimen observation time.

In this structure, if the temperature of the specimen is set to a desired value, the control unit 30 sends a signal for opening the solenoid valve 24 to the solenoid valve control circuit 26. In response to this signal, the valve control circuit 26 opens the solenoid valve 24. The system is placed in the cooling mode. When the temperature of the specimen stage 16 reaches the preset temperature, the control unit 30 sends a signal to the solenoid valve control circuit 26 so that the valve may be closed. As a result, the mode of operation of the instrument is switched to the observation mode, and the image is observed. As described previously, in the observation mode, the temperature of the specimen stage 16 rises gradually. If the temperature of the specimen stage 16 is higher than the preset temperature by a given amount $\Delta\theta$, the control unit 30 supplies a signal for opening the solenoid valve 24 to the valve control circuit 26. In consequence, the mode of operation of the instrument is switched to the cooling mode. The specimen stage is started to be cooled down. If the temperature of the specimen stage drops down to the preset temperature, the control unit 30 sends a signal for closing the valve 24 to the valve control circuit 26. These operations are subsequently repeated. The image of the specimen is observed with high resolution at a low temperature.

As can be understood from the description provided thus far, the inventive specimen-cooling system permits one to observe an image of a specimen without deteriorating the resolution of the observation means such as an electron microscope by suppressing the evaporation of the refrigerant. Therefore, the specimen can be observed more precisely at a desired low temperature without being affected by mechanical vibrations due to evaporation of the refrigerant.

Furthermore, the amount of the refrigerant consumed can be reduced by controlling the temperature by making use of the various modes of operation. This can lead to cost savings.

Having thus described my invention with the detail and particularity required by the Patent Laws, what is desired protected by Letters Patent is set forth in the following claims.

What is claimed is:

1. A cooling system for use with an electron microscope comprising:

a refrigerant-holding means for holding a refrigerant;

a refrigerant introduction passage for introducing said refrigerant from said refrigerant-holding means into a given heat-exchanging position;

a low temperature transfer means for transmitting low temperature of said refrigerant placed at said heat-exchanging position in said refrigerant introduction passage to a specimen;

an exhaust passage which is in communication with said refrigerant introduction passage and through which gas produced by evaporation of said refrigerant flows, said exhaust passage including a parallel circuit consisting of first and second conduit lines juxtaposed;

a flow rate-adjusting means mounted in said exhaust passage and acting to vary the flow rate of said gas, said flow rate-adjusting means comprising a solenoid valve mounted in said first conduit line and a flow rate-adjusting valve mounted in said second conduit line, said solenoid valve setting the flow rate of said gas to said maximum flow rate when said solenoid valve is open, said flow rate-adjusting valve being so set up or adjusted that the flow rate of said gas flowing through said exhaust passage assumes said minimum flow rate; and a control unit capable of establishing a plurality of modes of operation including a maximum flow rate mode in which said specimen is cooled rapidly and a minimum flow rate mode adapted for observation with the electron microscope, said control unit controlling said flow rate-adjusting means according to the flow rate of said gas such that said cooling system operates in one of said modes of operation, said control unit controlling said solenoid valve in such a way that it opens said solenoid valve in said maximum flow rate mode and closes said solenoid valve in said minimum flow rate mode.

2. A cooling system for use with an electron microscope as set forth in claim 1, wherein said low temperature transfer means comprises a heat storage body in thermal communication with said heat-exchanging position in said refrigerant introduction passage and acting to store said low temperature and a temperature transfer rod for transmitting low temperature stored in said heat storage body to said specimen.

3. A cooling system for use with an electron microscope as set forth in claim 1 or 2, wherein said control unit operates said cooling system in said maximum flow rate mode for a preset period $t_2$ and in said minimum flow rate mode for a preset period $t_1$ and repeats these two modes of operation alternately.

4. A cooling system for use with an electron microscope as set forth in claim 3, wherein the period $t_1$ of said minimum flow rate mode is determined according to a period for which said specimen is observed.

5. A cooling system for use with an electron microscope as set forth in claim 3, wherein said control unit is equipped with a means for determining the period $t_2$ of said maximum flow rate mode according to information about a set temperature, information about variations in temperature of said specimen in said maximum flow rate mode, and information about variations in temperature of said specimen in said minimum flow rate mode.

6. A cooling system for use with an electron microscope as set forth in claim 3, wherein said control unit switches the mode of operation between said minimum flow rate mode and said maximum flow rate mode according to information obtained by detecting the temperature of said specimen.

\* \* \* \* \*

UNITED STATES PATENT AND TRADEMARK OFFICE
CERTIFICATE OF CORRECTION

PATENT NO. : 5,735,129
DATED : April 7, 1998
INVENTOR(S) : Katsuji Ienaga

It is certified that error appears in the above-identified patent and that said Letters Patent is hereby corrected as shown below:

```
Title Page, after "[22] Filed: Oct. 25, 1996" insert:
   --[30] Foreign Application Priority Data
      Oct. 25, 1995   [JP]   Japan........ 7-277695--.
```

Signed and Sealed this

First Day of September, 1998

Attest:

BRUCE LEHMAN

Attesting Officer

Commissioner of Patents and Trademarks